United States Patent
Miya et al.

(10) Patent No.: US 6,893,792 B2
(45) Date of Patent: May 17, 2005

(54) POSITIVE RESIST COMPOSITION

(75) Inventors: Yoshiko Miya, Kyoto (JP); Kouji Toishi, Hannan (JP); Kazuhiko Hashimoto, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/366,673

(22) Filed: Feb. 14, 2003

(65) Prior Publication Data
US 2003/0194639 A1 Oct. 16, 2003

(30) Foreign Application Priority Data

Feb. 19, 2002 (JP) ........................................ 2002-041245
Apr. 3, 2002 (JP) ........................................ 2002-101002

(51) Int. Cl.⁷ ............................................... G03F 7/039
(52) U.S. Cl. ..................................... 430/270.1; 430/907
(58) Field of Search .............................. 430/907, 270.1

(56) References Cited

U.S. PATENT DOCUMENTS

| | | | | |
|---|---|---|---|---|
| 6,548,219 B2 | * | 4/2003 | Ito et al. ..................... | 430/907 |
| 6,593,058 B1 | * | 7/2003 | Feiring et al. ............... | 430/907 |
| 6,692,887 B1 | * | 2/2004 | Suwa et al. .................. | 430/907 |
| 6,710,148 B2 | * | 3/2004 | Harada et al. ............... | 430/907 |
| 6,720,129 B2 | * | 4/2004 | Lee et al. .................... | 430/907 |
| 2003/0082479 A1 | * | 5/2003 | Hatekeyama et al. ....... | 430/907 |
| 2003/0148213 A1 | * | 8/2003 | Kaneko et al. .............. | 430/907 |
| 2003/0152864 A1 | * | 8/2003 | Araki et al. ................. | 430/907 |
| 2003/0157432 A1 | * | 8/2003 | Rottstegge .................. | 430/907 |

* cited by examiner

*Primary Examiner*—Richard L. Schilling
(74) *Attorney, Agent, or Firm*—Birch, Stewart, Kolasch & Birch, LLP

(57) ABSTRACT

The present invention provides a positive resist composition comprising a resin which itself is insoluble or poorly soluble in an alkali aqueous solution but becomes soluble in an alkali aqueous solution by the action of an acid, and an acid generator, wherein the content of halogen atoms in the resin is 40% by weight or more, at least one of structural units constituting the resin is a structural unit having an alicyclic hydrocarbon skeleton, and the structural unit having an alicyclic hydrocarbon skeleton contains therein at least one group rendering the resin soluble in an alkali aqueous solution by the action of an acid, and at least one halogen atom.

21 Claims, No Drawings

POSITIVE RESIST COMPOSITION

This nonprovisional application claims priority under 35 U.S.C. § 119(a) on Patent Application No. 2002-041245 filed in Japan on Feb. 19, 2002 and 2002-101002 filed in Japan on Apr. 3, 2002, which is herein incorporated by reference.

BACKGROUND OF THE INVENTION

1. Field of the Invention

The present invention relates to a chemical amplification type positive resist composition.

2. Prior Art

For fine processing of semiconductors, a lithography process using a resist composition is usually adopted, and in lithography, it is theoretically possible to increase resolution higher when exposure wavelength is shorter as represented by the Raleigh diffraction limitation formula. As the exposure light source for lithography used for production of semiconductors, there are g ray having a wavelength of 436 nm, i ray having a wavelength of 365 nm, KrF excimer laser having a wavelength of 248 nm and ArF excimer laser having a wavelength of 193 nm, developed in this order, the wavelength becoming shorter year by year. Further, as the exposure light source of the next generation, $F_2$ excimer laser having a wavelength of 157 nm is promising. For exposure to KrF excimer laser and ArF excimer laser, what is called chemical amplification type resists utilizing the catalytic action of an acid generated by exposure are often used due to excellent sensitivity. Further, also for exposure to $F_2$ excimer laser, there is a high possibility of use of chemical amplification type resists due to a excellent sensitivity.

However, resins used in resists for KrF excimer laser exposure and ArF excimer laser exposure do not show sufficient transmittance for lights of wavelengths of 170 nm or less, for example, $F_2$ excimer laser having a wavelength of 157 nm. When transmittance is lower) various properties such as profile, contrast, sensitivity and the like are badly influenced.

An object of the present invention is to provide a resist composition excellent in transmittance for light of a wavelength of 170 nm or less and suitable particularly for $F_2$ excimer laser lithography.

The present inventors have found that a resist composition improved in transmittance at a $F_2$ excimer laser wavelength of 157 nm and excellent in balance of abilities such as sensitivity, resolution and the like can be produced by using a resin containing a structural unit having a specific skeleton.

SUMMARY OF THE INVENTION

The present invention relates to the followings;

<1> a positive resist composition comprising a resin which itself is insoluble or poorly soluble in an alkali aqueous solution but becomes soluble in an alkali aqueous solution by the action of an acid, and an acid generator, wherein the content of halogen atoms in the resin is 40% by weight or more, at least one of structural units constituting the resin is a structural unit having an alicyclic hydrocarbon skeleton, and the structural unit having an alicyclic hydrocarbon skeleton contains therein at least one group rendering the resin soluble in an alkali aqueous solution by the action of an acid, and at least one halogen atom (hereinafter, described as the present resist composition);

<2> the positive resist composition according to <1> wherein the alicyclic hydrocarbon skeleton is a skeleton of the following formula (1):

(1)

wherein $R_2$ and $R_3$ bond to form an alicyclic hydrocarbon ring together with adjacent carbon atom, the alicyclic hydrocarbon ring formed by $R_2$, $R_3$ and the carbon atom bonds to at least one group containing a group rendering a resin soluble in an alkali aqueous solution by the action of an acid, and bonds to at least one halogen atom; $R_1$ represents a hydrogen atom, halogen atom or aliphatic hydrocarbon group;

<3> the positive resist composition according to <2> wherein the cyclic hydrocarbon skeleton of the formula (1) is an alicyclic hydrocarbon skeleton of the formula (2):

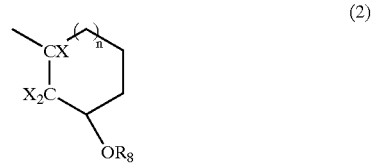

(2)

wherein X represents a halogen atom, $R_8$ represents a hydrogen or an acid-unstable group dissociating in the presence of an acid, and n represents 0 or 1;

<4> the positive resist composition according to <3> wherein the alicyclic hydrocarbon skeleton of the formula (2) is an alicyclic hydrocarbon skeleton containing a partial structure of the formula (3)

(3)

wherein C is a carbon atom forming an alicyclic hydrocarbon skeleton; $R_7$ represents an alkyl group having 1 to 6 carbon atoms substituted with at least one halogen atom or alicyclic hydrocarbon group substituted with at least one halogen atom; and $R_5$ has the same meaning as described above;

<5> the positive resist composition according to <4> wherein the cyclic hydrocarbon skeleton of the formula (2) is an alicyclic hydrocarbon skeleton of the formula (4):

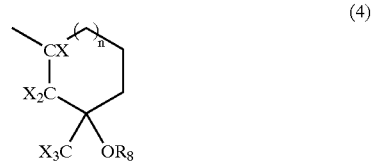

(4)

wherein X, $R_8$ and n have the same meanings as described above;

<6> the positive resist composition according to <5> wherein $R_8$ is a group of the formula (5):

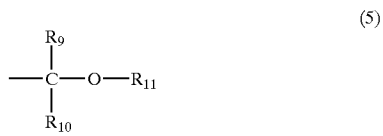

(5)

wherein $R_9$ and $R_{10}$ each independently represent an alkyl group having 1 to 14 carbon atoms or a hydrogen atom, the alkyl group may have at least one group selected from the group consisting of halogen atoms and alicyclic hydrocarbon groups; $R_{11}$ represents an alkyl group having 1 to 14 carbon atoms, alicyclic hydrocarbon group, lactone ring group or aromatic hydrocarbon group, the alkyl group may have at least one substituent selected from the group consisting of halogen atom, alicyclic hydrocarbon group and aromatic hydrocarbon group, the alicyclic hydrocarbon group, lactone ring group and aromatic hydrocarbon group in $R_{11}$ may each independently have at least one substituent selected from the group consisting of halogen atoms and alkyl groups;

<7> the positive resist composition according to <6> wherein in the formula (5), $R_9$ and $R_{10}$ represent a hydrogen atom, and $R_{11}$ represents an ethyl group;

<8> the positive resist composition according to <2> wherein the cyclic hydrocarbon skeleton of the formula (1) is a skeleton of the formula (6):

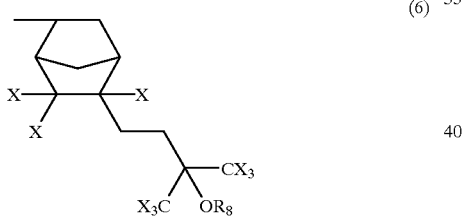

(6)

wherein X and $R_8$ have the same meanings as described above;

<9> the positive resist composition according to <1> wherein the halogen atom is a fluorine atom;

<10> the positive resist composition according to <1> wherein the structural unit having an alicyclic hydrocarbon skeleton is a structural unit of the formula (7):

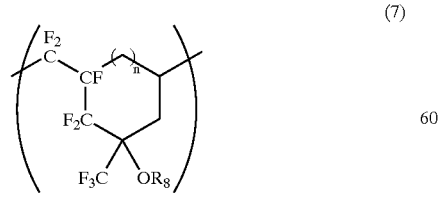

(7)

wherein n and $R_8$ have the same meanings as described above;

<11> the positive resist composition according to <1> wherein the structural unit having an alicyclic hydrocarbon skeleton is a structural unit of the formula (10):

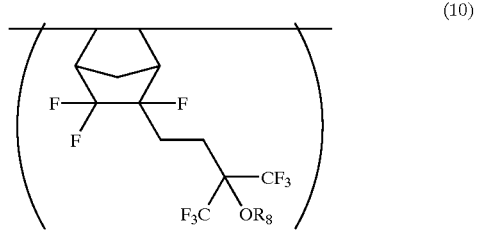

(10)

wherein $R_8$ has the same meaning as described above;

<12> the positive resist composition according to <1> wherein the resin is a copolymer containing a structural unit of the following formula (8) and a structural unit of the following formula (8-1):

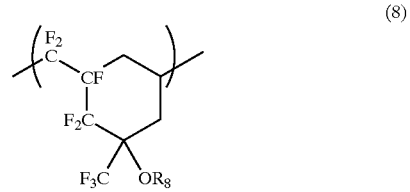

(8)

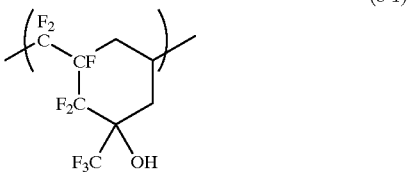

(8-1)

wherein $R_8$ has the same meaning as described above;

<13> the positive resist composition according to <1> wherein the resin is a copolymer containing a structural unit of the following formula (9) and a structural unit of the following formula (9-1):

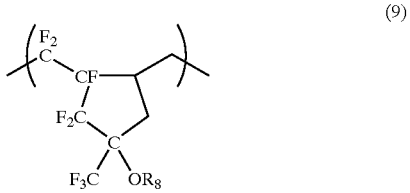

(9)

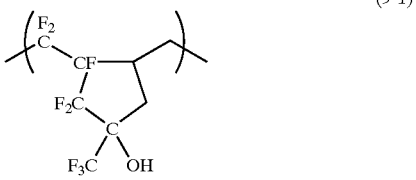

(9-1)

wherein, $R_8$ has the same meaning as described above;

<14> the positive resist composition according to <1> wherein the resin is a copolymer containing a structural unit of the following formula (10) and a structural unit of the following formula (10-1):

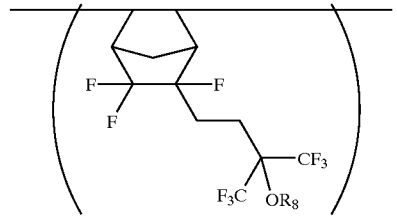
(10)

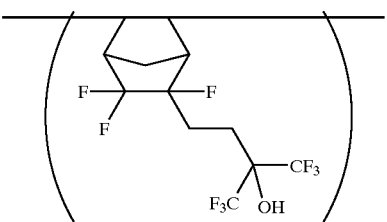
(10-1)

wherein, $R_8$ has the same meaning as described above;

<15> the positive resist composition according to <1> wherein the resin is a copolymer containing a structural unit of the following formula (11), a structural unit of the following formula (12) and a structural unit of the following formula (12-1):

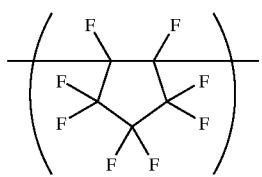
(11)

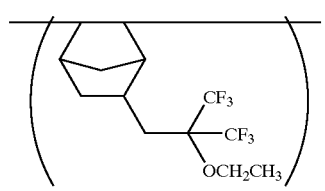
(12)

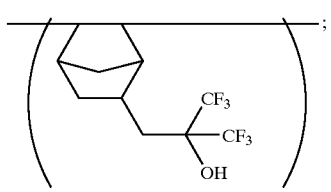
(12-1)

<16> the positive resist composition according to any one of <1> to <15> wherein the composition further comprises an acid generator of the general formula (14):

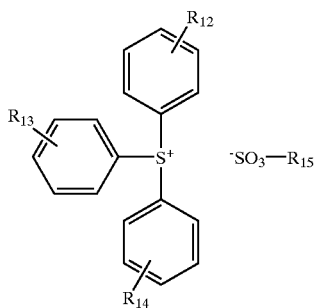
(14)

wherein $R_{12}$, $R_{13}$ and $R_{14}$ represent each independently a hydrogen atom, halogen atom, hydroxyl group, alkyl group having 1 to 14 carbon atoms or alkoxy group having 1 to 14 carbon atoms, wherein the alkyl group may have at least one substituent selected from the group consisting of halogen atoms, hydroxyl group, alicyclic hydrocarbon groups, lactone group and aromatic hydrocarbon groups, and the alicyclic hydrocarbon group, lactone group and aromatic hydrocarbon group may each independently have at least one substituent selected from the group consisting of halogen atoms, hydroxyl group and alkyl groups, the alkoxy group may have at least one substituent selected from the group consisting of halogen atoms, hydroxyl group, alicyclic hydrocarbon groups and aromatic hydrocarbon groups, the alicyclic hydrocarbon group and aromatic hydrocarbon group may each independently have at least one substituent selected from the group consisting of halogen atoms, hydroxyl group and alkyl groups; and $R_{15}$ represents straight chained or branched alkyl group optionally substituted with a halogen atom or alicyclic alkyl group optionally substituted with a halogen atom;

<17> the positive resist composition according to any one of <1> to <15> wherein the composition further comprises an acid generator of the general formula (15):

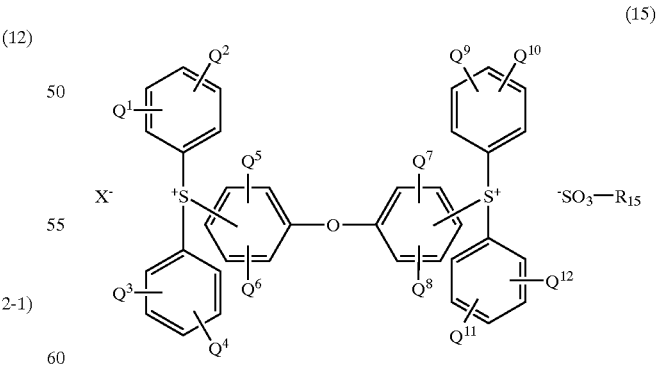
(15)

wherein $Q_1$ to $Q_{12}$ each independently represents hydrogen atom, hydroxyl group, straight chained or branched alkyl group having 1 to 6 carbon atoms or straight chained or branched alkoxy group having 1 to 6 carbon atoms; and $R_{15}$ has the same meaning as described above;

<18> the positive resist composition according to any one of <1> to <15> wherein the composition further comprises an acid generator of the general formula (16):

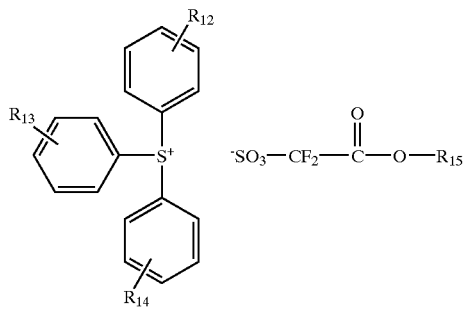

wherein $R_{12}$, $R_{13}$, $R_{14}$ and $R_{15}$ have the same meanings as defined above;
<19> the positive resist composition according to <16> wherein $R_{15}$ is a methyl group;
<20> the positive resist composition according to <16> wherein $R_{15}$ is a trifluoromethyl group;
<21> the positive resist composition according to any one of <1> to <20> wherein the proportion of the resin is 80 to 99.9% by weight and the proportion of the acid generator is 20 to 0.1% by weight based on the total weight of the resin and acid generator;
<22> the positive resist composition according to any one of <1> to <21> wherein the composition further comprises a basic compound;
<23> the positive resist composition according to <22> wherein the proportion of the basic compound is 0.001 to 1 part by weight based on 100 parts by weight of the resin; and
<24> the positive resist composition according to <22> or <23> wherein the basic compound is a compound of the following formula (17):

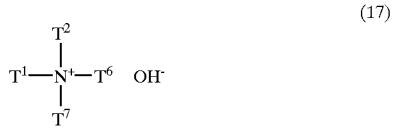

wherein $T^1$, $T^2$ and $T^7$ each independently represent alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms, at least one hydrogen on the alkyl, cycloalkyl or aryl may each independently be substituted with a hydroxyl group, an amino group, or an alkoxy group having 1 to 6 carbon atoms, and at least one hydrogen on the amino group each independently may be substituted with an alkyl group having 1 to 4 carbon atoms; $T^6$ represents alkyl or cycloalkyl, at least one hydrogen on the alkyl or cycloalkyl may each independently be substituted with a hydroxyl group, an amino group, or an alkoxy group having 1 to 6 carbon atoms, and at least one hydrogen on the amino group may be substituted with an alkyl group having 1 to 4 carbon atoms.

DETAILED DESCRIPTION OF PREFERRED EMBODIMENTS

The present resist composition comprises a resin which itself is insoluble or poorly soluble in an alkali aqueous solution but becomes soluble in an alkali aqueous solution by the action of an acid, and an acid generator.

In the present resist composition, the content of halogen atoms in the resin is 40% by weight or more, at least one of structural units constituting the resin is a structural unit having an alicyclic hydrocarbon skeleton, and the structural unit having an alicyclic hydrocarbon skeleton contains therein at least one group rendering the resin soluble in an alkali aqueous solution by the action of an acid, and the structural unit having an alicyclic hydrocarbon skeleton contains therein at least one halogen atom.

In the present invention, the term skeleton means a basic frame of a molecule or a group and represents a frame symbolized by removing hydrogen atoms and/or possible substituents from the structural formula with exception of the part(s) particularly manifested explicitly. Therefore, when hydrogen atom(s) or substituent(s) is(are) specified particularly in a skeleton, other unspecified parts indicate a frame. The alicyclic hydrocarbon skeleton includes a cycloalkane skeleton and the like. The term alicyclic hydrocarbon ring used in the present invention has the same, but more specific meaning as for the term alicyclic hydrocarbon skeleton (sometimes used for avoiding confusion).

As the alicyclic hydrocarbon skeleton, skeletons of the following formula (1) can be listed.

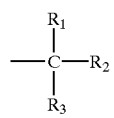

wherein $R_2$ and $R_3$ bond to form an alicyclic hydrocarbon ring together with adjacent C (carbon atom), the alicyclic hydrocarbon ring formed by $R_2$, $R_3$ and C bonds to at least one group containing a group rendering a resin soluble in an alkali aqueous solution by the action of an acid, and bonds to at least one halogen atom; $R_1$ represents a hydrogen atom, halogen atom or aliphatic hydrocarbon group.

As the alicyclic hydrocarbon ring formed by $R_2$, $R_3$ and C, a cyclopentane ring, cyclohexane ring and the like can be listed. As the halogen atom, a fluorine atom is preferable. As the group containing a group rendering a resin soluble in an alkali aqueous solution by the action of an acid, —$OR_8$ group described later, alkoxyalkyl group optionally substituted with at least one halogen atom, alkoxyalkoxyalkyl group optionally substituted with at least one halogen atom, and the like can be listed.

Specific examples of the alicyclic hydrocarbon skeleton of the formula (1), listed are alicyclic hydrocarbon skeletons of the (2):

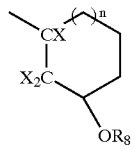

wherein X represents a halogen atom, $R_8$ represents a hydrogen atom or an acid-unstable group dissociating in the presence of an acid, and n represents 0 or 1;

alicyclic hydrocarbon skeletons of the (6):

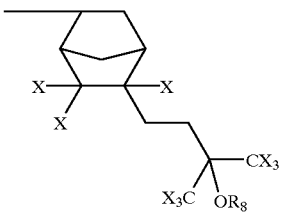
(6)

wherein X and $R_8$ have the same meanings as described above; and the like.

Further, other example of the alicyclic hydrocarbon skeleton is a skeleton containing a partial structure of the following formula (3):

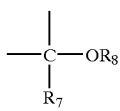
(3)

wherein C is a carbon atom forming an alicyclic hydrocarbon skeleton; $R_7$ represents an alkyl group having 1 to 6 carbon atoms substituted with at least one halogen atom or alicyclic hydrocarbon group substituted with at least one halogen atom; and $R_8$ has the same meaning as described above.

Examples of the alkyl group having 1 to 6 carbon atoms substituted with at least one halogen atom are fluoromethyl group, difluoromethyl group, trifluoromethyl group, 2,2,2-trifluoroethyl group, perfluoroethyl group, —$C(CF_3)_3$ group, and the like. This alkyl group may be straight chained or branched.

Examples of the alicyclic hydrocarbon group substituted with at least one halogen atom are perfluorocyclopentyl group, perfluorocyclohexyl group, and the like.

Specific examples of the skeleton containing a partial structure of the formula (3) as the alicyclic hydrocarbon skeleton, are alicyclic hydrocarbon skeleton of the formula (4):

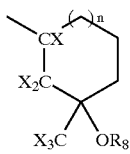
(4)

wherein X, $R_8$ and n have the same meanings as described above, and the like.

(0010)

Examples of $R_8$ are a group of the formula (5):

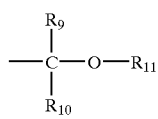
(5)

wherein $R_9$ and $R_{10}$ each independently represent an alkyl group having 1 to 14 carbon atoms or a hydrogen atom, the alkyl group may have at least one group selected from the group consisting of halogen atoms and alicyclic hydrocarbon groups; $R_{11}$ represents an alkyl group having 1 to 14 carbon atoms, alicyclic hydrocarbon group, lactone ring group or aromatic hydrocarbon group, the alkyl group may have at least one substituent selected from the group consisting of halogen atom, alicyclic hydrocarbon group and aromatic hydrocarbon group, the alicyclic hydrocarbon group, lactone ring group and aromatic hydrocarbon group in $R_{11}$ may each independently have at least one substituent selected from the group consisting of halogen atoms and alkyl groups.

Specific examples of $R^8$ include acetal type group such as 1-ethoxyethyl group, 1-(2-methylpropoxy)ethyl group, 1-(2-methoxyethoxy)ethyl group, 1-(2-acetoxyethoxy)ethyl group, 1-[2-(1-adamantyloxy)ethoxy]ethyl group, 1-[2-(1-adamantanecarbonyloxy)ethoxy]ethyl group, adamantyloxymethyl group, bicyclohexyloxymethyl group, adamantylmethoxymethyl group, methoxymethyl group, ethoxymethyl group, pivaloyloxymethyl group, methoxyethoxymethyl group, benzyloxymethyl group, di(trifluoromethyl)methoxymethyl group, and the like.

Particularly because of easy availability and easy synthesis, methoxymethyl group and ethoxymethyl group are preferably used.

The acid-unstable group dissociating in the presence of an acid is substituted with a hydrogen atom to become an alkali soluble group by the action of an acid.

The acid-unstable group dissociating in the presence of an acid ($R_8$) can be easily introduced into a resin by performing a known protective group introducing reaction or conducting polymerization using as one monomer an unsaturated compound having such a group.

In the above-mentioned formula (3), it is preferable that $R_7$ is trifluoromethyl group since the transmittance of vacuum ultraviolet ray typified by 157 nm of resin composition increases.

Examples of the group having an alicyclic hydrocarbon skeleton of the formula (1), for example are alicyclic hydrocarbon groups in which carbon atoms forming the skeleton bond to hydrogen atoms, excepting portions bonded to a halogen atom or a group containing a group rendering a resin soluble in an alkali aqueous solution by the action of an acid; and alicyclic hydrocarbon groups in which at least one hydrogen atom bonding to a carbon atom is substituted with a (halo)alkyl group.

Examples of the structural unit having an alicyclic hydrocarbon skeleton of the formula (1), are structural units of the following formulae (8), (9), (10) and the like.

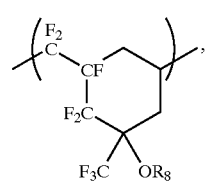
(8)

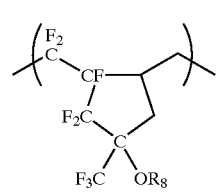
(9)

-continued (10)

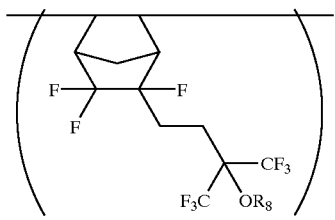

The resin used in the present invention can be obtained by polymerization according to a known polymerization reaction. Namely, a monomer capable of inducing the above-mentioned structural unit, and an initiator can be mixed and stirred at suitable temperature, in the presence or absence of a solvent, to effect the polymerization A catalyst may be mixed, if necessary. The resulted polymer can be precipitated in a suitable solvent, for purification.

The resin in the present resist composition may be a resin substantially consisting of a structural unit having an alicyclic hydrocarbon skeleton and containing therein at least one group rendering the resin soluble in an alkali aqueous solution by the action of an acid, and at least one halogen atom. However, usually used are copolymers of the above-mentioned structural unit with the same structural unit as the above-mentioned structural unit excepting that a group rendering the resin soluble in an alkali aqueous solution by the action of an acid is not contained, namely, a group rendering the resin soluble in an alkali aqueous solution even without the action of an acid is contained. Specific example thereof is structural units of the above-mentioned formulas (8), (9) and (10) in which —$OR_8$ group is substituted by OH group.

Specifically listed are a copolymer composed of a structural unit of the formula:

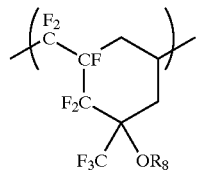

and a structural unit of the formula:

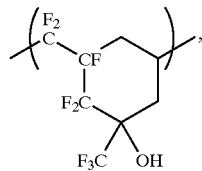

a copolymer composed of a structural unit of the formula:

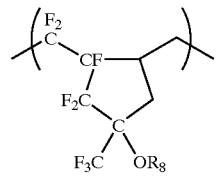

and a structural unit of the formula:

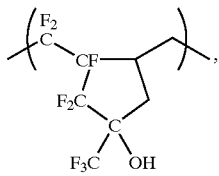

a copolymer composed of a structural unit of the formula:

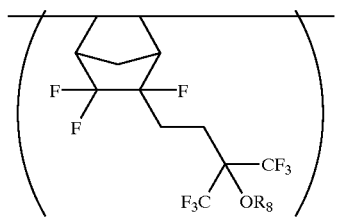

and a structural unit of the formula:

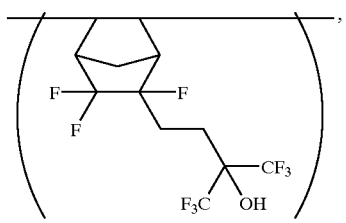

mixtures of these copolymers, and the like.

More specific examples thereof include a copolymer composed of a structural unit of the formula:

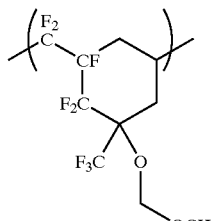

and a structural unit of the formula:

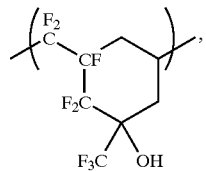

a copolymer composed of a structural unit of the formula:

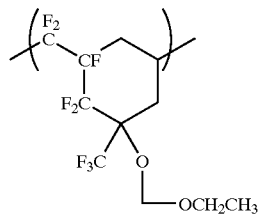

and a structural unit of the formula:

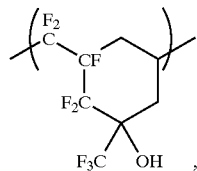

a copolymer composed of a structural unit of the formula:

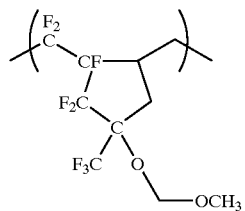

and a structural unit of the formula:

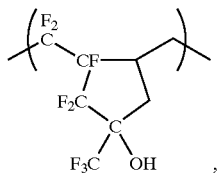

a copolymer composed of a structural unit of the formula:

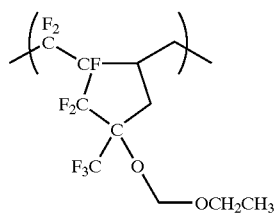

and a structural unit of the formula:

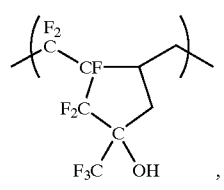

a copolymer composed of a structural unit of the formula:

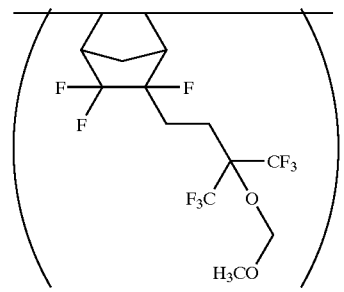

and a structural unit of the formula:

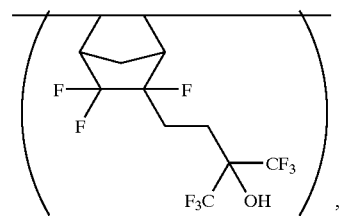

a copolymer composed of a structural unit of the formula:

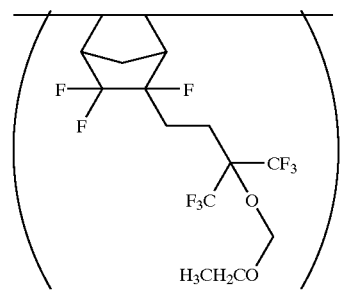

and a structural unit of the formula:

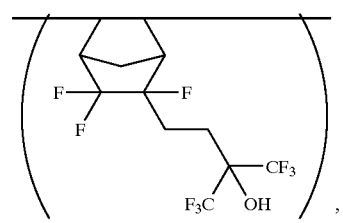

mixtures of these copolymers, and the like.

Besides, a copolymer composed of structural units of the formulae:

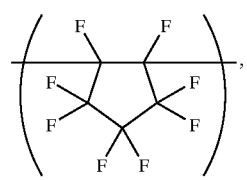

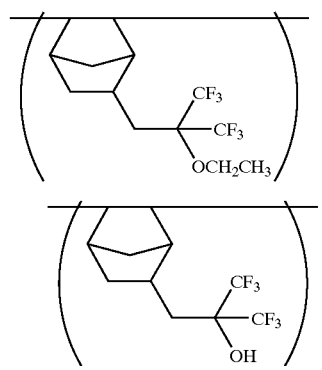

are also listed.

The resin use in the present invention contains halogen atoms in an amount of 40% by weight or more in the resin. Though varying depending on the kind of radiation for patterning exposure, the kind of a group dissociating by the action of an acid, and the like, it is generally preferable to contain 15 to 50 mol % of a structural unit having an alicyclic hydrocarbon skeleton and containing therein at least one group rendering the resin soluble in an alkali aqueous solution by the action of an acid, and at least one halogen atom.

The acid generator used in the present invention is not particularly restricted providing the acid generator decomposes to generate an acid by allowing radiation such as light, electron beam and the like to act on the acid generator itself or a resist composition containing the acid generator.

An acid generated from the acid generator acts on the above-mentioned resin to dissociate a group dissociating by the action of an acid present in the resin.

As the acid generator, for example, onium salt compounds, organohalogen compounds, sulfone compounds, sulfonate compounds and the like are listed.

As the sulfonate compound, compounds of the general formulae (14), (15) and (16) are listed.

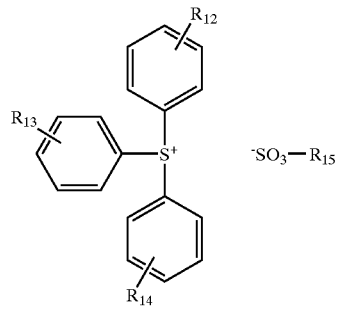

(14)

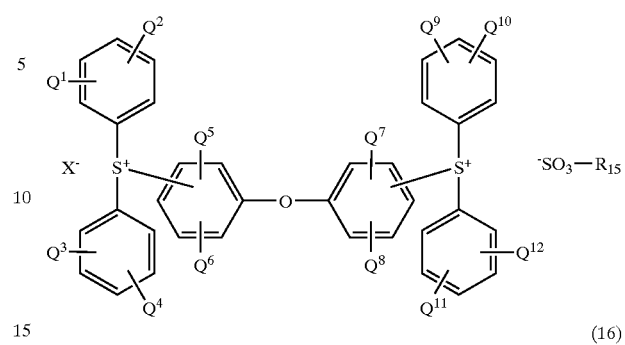

(15)

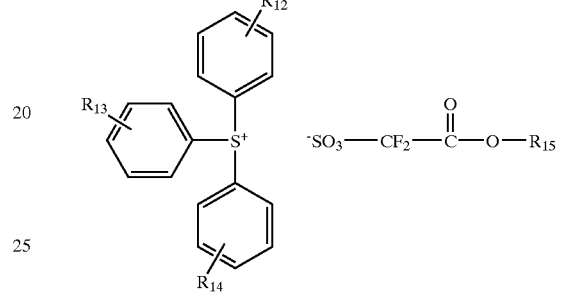

(16)

wherein $R_{12}$, $R_{13}$ and $R_{14}$ represent each independently a hydrogen atom) halogen atom, hydroxyl group, alkyl group having 1 to 14 carbon atoms or alkoxy group having 1 to 14 carbon atoms, wherein the alkyl group may have at least one substituent selected from the group consisting of halogen atoms, hydroxyl group, alicyclic hydrocarbon groups, lactone group and aromatic hydrocarbon groups, and the alicyclic hydrocarbon group, lactone group and aromatic hydrocarbon group may each independently have at least one substituent selected from the group consisting of halogen atoms, hydroxyl group and alkyl groups, the alkoxy group may have at least one substituent selected from the group consisting of halogen atoms, hydroxyl group, alicyclic hydrocarbon groups and aromatic hydrocarbon groups, the alicyclic hydrocarbon group and aromatic hydrocarbon group may each independently have at least one substituent selected from the group consisting of halogen atoms, hydroxyl group and alkyl groups; $R_{15}$ represents straight chained or branched alkyl group optionally substituted with a halogen atom or alicyclic alkyl group optionally substituted with a halogen atom; $Q^1$ to $Q^{12}$ each independently represents hydrogen atom, hydroxyl group, straight chained or branched alkyl group having 1 to 6 carbon atoms or straight chained or branched alkoxy group having 1 to 6 carbon atoms.

The compounds in which $R_{15}$ is a trifluoromethyl group are preferable from the standpoint of resolution.

Specific examples of the acid generating agents include the following compounds.
Diphenyliodonium trifluoromethanesulfonate,
4-methoxyphenylphenyliodinium hexafluoroantimonate,
4-methoxyphenylphenyliodinium trifluoromethanesulfonate,
bis(4-tert-butylphenyl)iodonium tetrafluoroborate
bis(4-tert-butylphenyl)iodonium perfluorobutanesulfonate,
bis(4-tert-butylphenyl)iodonium hexafluorophosphate,
bis(4-tert-butylphenyl)iodonium hexafluoroantimonate
bis(4-tert-butylphenyl)iodonium trifluoromethanesulfonate,
bis(4-tert-butylphenyl)iodonium camphorsulfonate,
triphenylsulfonium hexafluorophosphate, triphenylsulfonium hexafluoroantimonate,
triphenylsulfonium trifluoromethanesulfonate,
triphenylsulfonium perfluorobutanesulfonate,
triphenylsulfonium perfluorooctanesulfonate,
tri(4-methylphenyl)sulfonium trifluoromethane sulfonate,
tri(4-methylphenyl)sulfonium perfluorobutanesulfonate,
tri(4-methylphenyl)sulfonium perfluorooctanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphtholylmethyl)thiolanium hexafluoroantimonate,
1-(2-naphtholylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxocyclohexyl)sulfonium perfluorootcanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromethyl)-1,3,5-triazine,
2)-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
1-benzoyl-1-phenylmethyl p-toluenesulfonate (generally called "benzoin tosylate"),
2-benzoyl-2-hydroxy-2-phenylethyl p-toluenesulfonate (generally called α-methylolbenzoin tosylate),
1,2,3-benzene-tri-yl tris(methanesulfonate),
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide and the like,
(oxydi-4,1-phenylene)bisdiphenylsulfonium bis(methanesulfonate),
(oxydi-4,1-phenylene)bisdiphenylsulfonium bis(benzenesulfonate),
(oxydi-4,1-phenylene)bisdiphenylsulfonium bis(p-toluenesulfonate),
(oxydi-4,1-phenylene)bisdiphenylsulfonium bis(camphorsulfonate),
(oxydi-4,1-phenylene)bisdiphenylsulfonium bis(triisopropyobenzenesulfonate),
(oxydi-4,1-phenylene)bisdiphenylsulfonium bis(pentafluorobenzenesulfonate),
(oxydi-4,1-phenylene)bisdiphenylsulfonium bis(trifluoromethanesulfonate),
(oxydi-4,1-phenylene)bisdiphenylsulfonium bis(perfluorobutanesulfonate),
(oxydi-4,1-phenylene)bisdiphenylsulfonium bis(perfluorooctanesulfonate),
(oxydi-4,1-phenylene)bisdiphenylsulfonium bis{trifluoro-N-[(perfluoromethyl)sulfonyl]-1-methanesulfonamidate},
(oxydi-4,1-phenylene)bisdiphenylsulfonium bis{perfluoro-N-[(perfluoroethyl)sulfonyl]-1-ethanesulfonamidate},
(oxydi-4,1-phenylene)bisdiphenylsulfonium bis{perfluoro-N-[(perfluorobutyl)sulfonyl]-1-butanesulfonamidate},
(oxydi-4,1-phenylene)bisdiphenylsulfonium bis{trifluoro-N-[(perfluorobutyl)sulfonyl]-1-methanesulfonamidate},
(oxydi-4,1-phenylene)bisdiphenylsulfonium bis(tetrafluoroborate),
(oxydi-4,1-phenylene)bisdiphenylsulfonium bis(hexafluoroarsenate),
(oxydi-4,1-phenylene)bisdiphenylsulfonium bis(hexafluoroantimonate),
(oxydi-4,1-phenylene)bisdiphenylsulfonium bis(hexafluorophosphate),
(0029)
(oxydi-4,1-phenylene)bisdi(4-tert-butylphenyl)sulfonium bis(trifluoromethanesulfonate),
(oxydi-4,1-phenylene)bisdi(4-tert-butylphenyl)sulfonium bis(perfluorobutanesulfonate),
(oxydi-4,1-phenylene)bisdi(p-tolyl)sulfonium bis(trifluoromethanesulfonate),
triphenylsulfonium (adamantan-1-ylmethyl)oxycarbonyldifluoromethanesulfonate, and the like.

In addition, when the present resist composition is the one used for a positive resist composition, performance deterioration due to the deactivation of an acid associated with leaving after exposure can be reduced by adding basic compounds, particularly basic nitrogen-containing organic compounds such as an amine. Specific examples of such basic compounds include the ones represented by the following formulae:

(17)

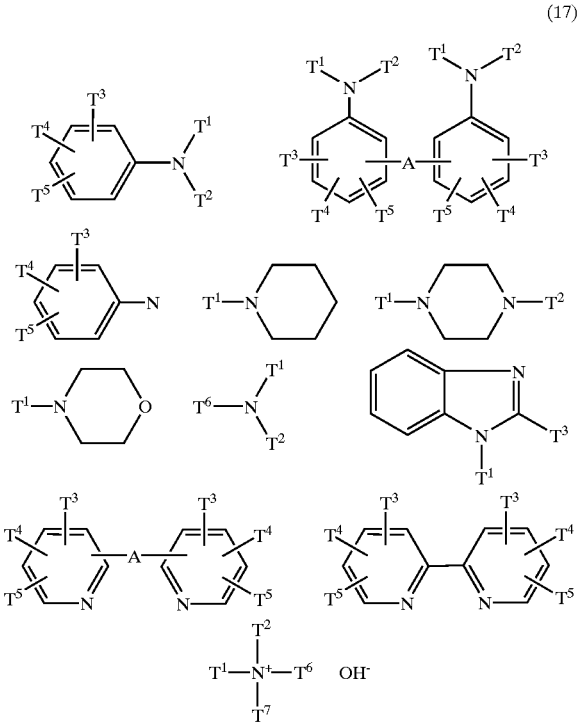

wherein T¹, T² and T⁷ each independently represent hydrogen, alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with a hydroxyl group, an amino group, or an alkoxy group having 1 to 6 carbon atoms. At least one hydrogen on the amino group each independently may be substituted with an alkyl group having 1 to 4 carbon atoms.

T³, T⁴ and T⁵ each independently represent hydrogen, alkyl, cycloalkyl, aryl or alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy each independently may be substituted with a hydroxyl group, an amino group, or an alkoxy group having 1 to 6 carbon atoms. At least one hydrogen on the amino group may be substituted with an alkyl group having 1 to 4 carbon atoms.

T⁶ represents alkyl or cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with a hydroxyl group, an amino group, or an alkoxy group having 1 to 6 carbon atoms. At least one hydrogen on the amino group may be substituted with an alkyl group having 1 to 4 carbon atoms.

However, none of T¹, T², T⁶ and T⁷ in the compound represented by the above formula (17) is hydrogen.

A represents alkylene, carbonyl, imino, sulfide or disulfide. The alkylene preferably has about 2 to 6 carbon atoms.

Moreover, among T¹–T⁷, in regard to those which can be straight-chained or branched, either of these may be permitted.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, trihexylanine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmnethylamine, tris[2-(2-methoxyethoxy)ethyl]amine, triisopropanolamine, N,N-dimethylaniline, 2,6-isopropylaniline, imidazole, pyridine, 4-methylpyridine, 4-methylmidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane), 2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "cholline"), and the like, Furthermore, hindered amine compounds having piperidine skeleton as disclosed in JP-A-H11-52575 can be used as quencher.

For improvement of resolution, it is preferable to use the compounds represented by the formula (14) as quencher. Specific preferred examples include tetramethylammonium hydroxide, tetrabutylammonium hydroxide, tetrahexylammonium hydroxide, tetraoctylammonium hydroxide, phenyltrimethylammonium hydroxide and 3-trifluoromethylphenyltrimethylammonium hydroxide.

Weight percentage of the resin is preferably 80 to 99.9% by weight, and weight percentage of the acid generator is 20 to 0.1% by weight both based on total weight of the resin and acid generator in the present resist composition.

When a basic compound is used in the present resist composition, it is preferred that the composition preferably contains the basic compound in the range of 0.001 to 1% by weight based on the content of total solid components of the present resist composition.

The present resist composition may also contain various additives such as sensitizers, dissolution inhibitors, resins other than the above resin, surfactants, stabilizers, and dyes as long as the effect of the present invention is not obstructed.

The present resist composition generally becomes a liquid resist composition under the circumstances in which each of the above-described components is dissolved in a solvent. The liquid resist composition is applied on a substrate such as a silicon wafer according to a usual procedure such as spin coating.

Any solvent may be used as long as they dissolve each component, show suitable drying speed, and give a uniform and smooth film after evaporation of the solvent. Solvents generally used in this field can be used as the solvent.

Examples thereof include glycol ether esters such as ethylcellosolve acetate, methylcellosolve acetate, propylene glycol monomethyl ether acetate and the like; ethers such as diethyleneglycol dimethyl ether and the like; esters such as ethyl lactate, butyl acetate, amyl acetate, ethyl pyruvate and the like; ketones such as acetone, methyl isobutyl ketone, 2-heptanone, cylohexanone and the like; and cyclic esters such as γ-butyrolactone and the like. These solvents can be used each alone or in combination of two or more.

The resist film applied on a substrate, and dried is subjected to an exposure treatment for patterning. Then, after a heat-treatment for promoting a deprotecting reaction, development by an alkali developer is conducted. The alkali developer used herein can be various kinds of aqueous alkaline solutions used in this art. In general, an aqueous solution of tetramethylammonium hydroxide or (2-hydroxyethyl)trimethylammonium hydroxide (generally referred to as colline) is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The following examples will illustrate the present invention further specifically, but do not limit the scope of the invention at all. Parts in the examples are by weight unless otherwise stated. The weight-average molecular weight and degree of dispersion were omeasured by gel permeation chromatography using polystyrene as a standard.

RESIN SYNTHESIS EXAMPLE

Resin A1

A resin #010730 which is produced by paratial (30%) methoxymethylation of resin A-1 obtained from Asahi Glass Co., Ltd. was used.

Synthesis Example of Resin A2 (Weight-average Molecular Weight: about 63451)

Partial EOM (Abbreviation of Ethoxymethylation) of Resin A-1 (#011115-2) Obtained from Asahi Glass Co., Ltd. (Protection Ratio 31%)

1.5 g of A-1 (weight-average molecular weight: about 35000) was added to 15 g of methyl isobutyl ketone in a flask and dissolved, and then 1.25 g of diisopropylethylamine was added to the solution. Thereafter, 0.76 g of ethoxymethyl chloride was dropped therein, and mixture was reacted at room temperature for 9 hours, then, 0.62 g of diisopropylethylamine was further added, 0.38 g of ethoxymethyl chloride was dropped into the mixture, and mixture was reacted at room temperature for 9 hours. After the reaction, suitable amount of methyl isobutyl ketone was added therein, and washing with ion-exchanged water was repeated. The organic layer was concentrated, then, diluted with suitable amount of acetone, and dropped into mixed solution of 91 g of water and 61 g of methanol, to precipitate resin. After filtration, the solid was dried in vacuo to obtain 1.3 g of resin. The weight-average molecular weight was about 45000, and the ethoxymethylation ratio was about 31% according to a nuclear magnetic resonance ($^1$H-NMR) spectrometer.

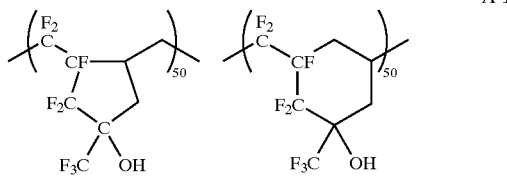

A-1

Synthesis Example of Resin A3

Partial EOM of Resin A-1 (#011115-2) Obtained from Asahi Glass Co., Ltd. (Protection Ratio 24%)

2.1 g of A-1 was added to 21 g of methyl isobutyl ketone in a flask and dissolved, and then 0.86 g of diisopropylethylamine was added to the solution. Thereafter, 0.52 g of ethoxymethyl chloride was dropped therein, and mixture was reacted at room temperature for 18 hours, then, 0.86 g of diisopropylethylamine was further added, 0.52 g of ethoxymethyl chloride was dropped into the mixture, and mixture was reacted at room temperature for 6 hours. After the reaction, suitable amount of methyl isobutyl ketone was added therein, and washing with ion-exchanged water was repeated. The organic layer was concentrated, then, diluted with suitable amount of acetone, and dropped into mixed solution of 126 g of water and 84 g of methanol, to precipitate resin. After filtration, the solid was dried in vacuo to obtain 1.9 g of resin. The weight-average molecular weight was about 42000, and the ethoxymethylation ratio was about 24% according to a nuclear magnetic resonance ($^1$H-NMR) spectrometer.

Synthesis Example of Resin A4

Partial EOM of Resin A-1 (#011115-2) Obtained from Asahi Glass Co., Ltd. (Protection Ratio 26%)

2.5 g of A-1 (weight-average molecular weight: about 49000) was added to 25 g of N,N-dimethylformamide in a flask and dissolved, and then 0.82 g of diisopropylethylamine was added to the solution. Thereafter, 0.50 g of ethoxymethyl chloride was dropped therein, and mixture was reacted at room temperature for 6 hours, then, 0.51 g of diisopropylethylamine was further added, 0.31 g of ethoxymethyl chloride was dropped into the mixture, and mixture was reacted at room temperature for 22 hours. After the reaction, suitable amount of methyl isobutyl ketone was added therein, and washing with ion-exchanged water was repeated. The organic layer was concentrated, then, diluted with suitable amount of acetone, and dropped into mixed solution of 100 g of water and 150 g of methanol, to precipitate resin. After filtration, the solid was dried in vacuo to obtain 2.26 g of resin. The weight-average molecular weight was about 52000, and the ethoxymethylation ratio was about 26% according to a nuclear magnetic resonance ($^1$H-NMR) spectrometer.

Synthesis Example of Resin A5

Partial EOM of A-2 (#011115-1) Obtained from Asahi Glass Co., Ltd. (Protection Ratio 26%)

2.5 g of A-2 (weight-average molecular weight: about 22000) having a structural unit described below was added to 25 g of N,N-dimethylformamide in a flask and dissolved, and then 1.33 g of diisopropylethylamine was added to the solution. Thereafter, 0.83 g of ethoxymethyl chloride was dropped therein, and mixture was reacted at room temperature for 6.5 hours. After the reaction, suitable amount of methyl isobutyl ketone was added therein, and washing with ion-exchanged water was repeated. The organic layer was concentrated, then, diluted with suitable amount of acetone, and dropped into mixed solution of 100 g of water and 150 g of methanol, to precipitate resin. After filtration, the solid was dried in vacuo to obtain 2.30 g of resin. The weight-average molecular weight was about 23000, and the ethoxymethylation ratio was about 26% according to a nuclear magnetic resonance ($^1$H-NMR) spectrometer.

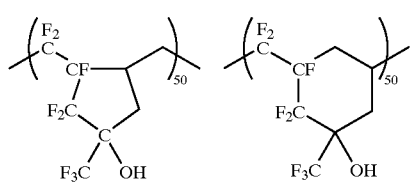

A-2

Synthesis Example of Resin A6
Partial EOM of A-1 (#011115-2) Obtained from Asahi Glass Co., Ltd. (Protection Ratio 35%)

2.5 g of A-1 was added to 25 g of methyl isobutyl ketone in a flask and dissolved, and then 2.33 g of diisopropylethylamine was added to the solution. Thereafter, 1.42 g of ethoxymethyl chloride was dropped therein, and mixture was reacted at room temperature for 2.5 hours. After the reaction, washing with ion-exchanged water was repeated. The organic layer was concentrated, then, diluted with suitable amount of acetone, and dropped into mixed solution of 100 g of water and 150 g of methanol, to precipitate resin. After filtration, the solid was dried in vacuo to obtain 2.45 g of resin. The weight-average molecular weight was about 54000, and the ethoxymethylation ratio was about 35% according to a nuclear magnetic resonance ($^1$H-NMR) spectrometer,

Synthesis Example of Resin A7
Partial EOM of A-1 (#011115-2) Obtained from Asahi Glass Co., Ltd. (Protection Ratio 21%)

2.5 g of A-1 was added to 25 g of N,N-dimethylformamide in a flask and dissolved. 0.39 g of potassium iodide was added to the solution, and then, 1.30 g of potassium carbonate was added therein. Thereafter, 0.18 g of ethoxymethyl chloride was dropped therein, and mixture was reacted at room temperature for 4.5 hours. 0.08 g of ethoxymethyl chloride was dropped into the mixture, and mixture was reacted at room temperature for 6 hours. After the reaction, suitable amount of methyl isobutyl ketone was added therein, and washing with ion-exchanged water was repeated. The organic layer was concentrated, then, diluted with suitable amount of acetone, and dropped into mixed solution of 100 g of water and 150 g of methanol, to precipitate resin. After filtration, the solid was dried in vacuo to obtain 2.15 g of resin. The weight-average molecular weight was about 57000, and the ethoxymethylation ratio was about 21% according to a nuclear magnetic resonance ($^1$H-NMR) spectrometer.

Resin Synthesis Example 9

Synthesis Example of Resin AX
(Synthesis of 2-ethyl-2-adamantyl methacrylate/3-hydroxy-1-adamantyl methacrylate/α-methacryloyloxy-γ-butyrolactone copolymer (resin AX))

2-ethyl-2-adamantyl methacrylate, 3-hydroxy-1-adamantyl acrylate and α-methacryloyloxy-γ-butyrolactone were charged in a molar ratio of 2:1:1 (20.0 g:8.9 g:6.5 g), and methyl isobutyl ketone of twice weight of the total monomer weight was added to this to prepare a solution. To this was added azobisisobutyronitrile as an initiator in an amount of 2 mol % based on the total monomer amount, and the temperature was raised to 85° C. and the mixture was stirred for about 5 hours. The reaction mass was cooled, then, poured into a large amount of heptane, to cause precipitation; this operation Was repeated three times for purification. As a result, a copolymer having a weight-average molecular weight of about 8000 was obtained in a yield of 60%. This resin is called Resin AX.

Examples and Comparative Examples 10 parts of resin of the kind shown in Table 1 was dissolved, in combination with a light acid generator and a quencher shown in the following table, in propylene glycol monomethyl ether acetate/γ-butyrolactone (=95/5), further, filtrated through a fluorine resin filter having a pore diameter of 0.2 μm, to prepare a resist.

Light Acid Generator
  A: p-tolyldiphenylsulfonium perfluorooctanesulfonate
  B: p-tolyldiphenylsulfonium trifluoromethanesulfonate
  C: tri(p-tolyl)sulfonium trifluoromethanesulfonate
  D: (oxydi-4,1-phenylene)bisdiphenylsulfonium bis(perpluorooctanesulfonate)
  E: triphenylsulfonium (adamantan-1-ylmethyl) oxycarbonyldifluoromethanesulfonate
Quencher
  F: 2,6-diisopropylaniline
  G: tetrabutylammonium hydroxide

Table 1

| Example No. | Resin (10 parts) | Light acid generator (parts are described in table) | Quencher, 0.0075 parts |
|---|---|---|---|
| Example 1 | A1 | B(0.11 part) | F |
| Example 2 | A1 | B(0.11 part) | G |
| Example 3 | A2 | B(0.11 part) | F |
| Example 4 | A2 | B(0.11 part) | G |
| Example 5 | A2 | A(0.20 part) | F |
| Example 6 | A2 | A(0.20 part) | G |
| Example 7 | A3 | B(0.11 part) | F |
| Example 8 | A3 | B(0.11 part) | G |
| Example 9 | A4 | B(0.11 part) | G |
| Example 10 | A4 | C(0.13 part) | G |
| Example 11 | A5 | B(0.11 part) | G |
| Example 12 | A6 | B(0.11 part) | G |
| Example 13 | A7 | B(0.11 part) | G |
| Example 14 | A7 | C(0.13 part) | G |
| Comparative example 1 | AX | B(0.11 part) | F |
| Comparative example 2 | AX | A(0.20 part) | F |

Properties of Sensitivity and Resolution

The resist solution prepared above was spin-coated on a silicon wafer carrying thereon an organic reflection prevention membrane having a thickness of 1600 Å formed by applying "DUV-30J-14" which is organic reflection prevention membrane composition manufactured by Brewer, and baking it under conditions of 215° C. and 60 seconds, so that the membrane thickness after drying was 0.19 μm. After application of the resist solution, prebaking on a direct hot plate for 60 seconds was conducted under conditions of 110° C. and 60 seconds in Examples 1 to 14 and under conditions of 130° C. and 60 seconds in Comparative Examples 1 and 2. The wafer on which a resist membrane had thus been formed was exposed to a liner and space pattern using ArF excimer stepper ["NSR ArF" manufactured by Nikon Corp., NA=00.55, σ=0.6] while gradually changing the exposure amount.

After exposure, post exposure baking on a hot plate for 60 seconds was conducted under conditions of 110° C. and 60 seconds in Examples 1 to 14 and under conditions of 130° C. and 60 seconds in Comparative Examples 1 and 2, further, paddle development for 60 seconds was conducted with a 2.38 wt % tetramethylammonium hydroxide aqueous solution.

The line and space pattern after development on the organic reflection prevention membrane substrate was observed by a scanning electron microscope, methods, and the results are shown in Table 2 and 4.

Effective sensitivity: It is represented by exposure amount at which a 0.18 μm liner and space pattern of 1:1 is obtained.

Resolution: It is represented by the minimum dimension of a line and space pattern separating by exposure amount at the effective sensitivity.

Profile T/B: It is represented by ratio of the length of the upper side (T) to the length of the bottom side (B) of the section of 0.18 μm line. When the ratio is nearer to 1, the profile is more excellent.

A solution prepared by dissolving only the resist solution prepared above and a resin in a propylene glycol monomethyl ether acetate was applied on a magnesium fluoride wafer, so that the membrane thickness after drying was 0.1 μm, and prebaked on a direct hot plate under conditions of 110° C. and 60 seconds, to form a resist membrane. The transmittance of thus formed resist membrane at a wavelength of 157 nm was measured using a vacuum ultraviolet spectrometer (VUV-200, manufactured by Nippon Bunko K.K.). The results obtained are shown in Tables 2 and 4.

TABLE 2

| Example No. | Effective sensitivity | Resolution | T/B | Transmittance at 157 nm |
|---|---|---|---|---|
| Example 1 | 18 | 0.16 | 1.2 | 86 |
| Example 2 | 24 | 0.17 | 1.4 | 87 |
| Example 3 | 16 | 0.18 | 1.0 | 86 |
| Example 4 | 16 | 0.18 | 1.2 | 88 |
| Example 5 | Not penetrated through membrane | | | 90 |
| Example 6 | Not penetrated through membrane | | | 90 |
| Example 7 | 16 | 0.15 | 0.21 | 90 |
| Example 8 | 18 | 0.15 | 0.92 | 89 |
| Example 9 | 24 | 0.17 | 1.2 | 91 |
| Example 10 | 30 | 0.18 | 1.3 | 90 |
| Example 11 | 40 | 0.17 | 1.0 | 90 |
| Example 12 | 19 | 0.18 | 1.1 | 90 |
| Example 13 | 40 | 0.17 | 0.9 | 90 |
| Example 14 | 31 | 0.16 | 1.1 | 90 |
| Comparative example 1 | 18 | 0.17 | 0.89 | 22 |
| Comparative example 2 | 19 | 0.15 | 0.93 | 21 |

TABLE 3

| Example No. | Resin (10 parts) | Light acid generator (parts are described in table) | Quencher, 0.0075 parts |
|---|---|---|---|
| Example 15 | A4 | B(0.33 part) | G(0.0075 part) |
| Example 16 | A4 | B(0.55 part) | G(0.0075 part) |
| Example 17 | A4 | B(0.77 part) | G(0.0075 part) |
| Example 18 | A4 | B(0.99 part) | G(0.0075 part) |
| Example 19 | A4 | A(1.40 parts) | G(0.0075 part) |
| Example 20 | A4 | A(2.00 parts) | G(0.0075 part) |
| Example 21 | A4 | D(0.67 part) | G(0.0075 part) |
| Example 22 | A4 | E(0.51 part) | G(0.0075 part) |
| Comparative example 3 | A4 | B(0.11 part) | E(0.0075 part) |
| Comparative example 4 | A4 | A(0.20 part) | E(0.0075 part) |

Property in Sensitivity in $F_2$ Excimer Laser Exposure

The resist solution prepared above was spin-coated on a silicon wafer carrying thereon an organic reflection prevention membrane having a thickness of 1600 Å formed by applying "DUV-30J-14" which is an organic reflection prevention membrane composition manufactured by Brewer and baking it under conditions of 215° C. and 60 seconds, so that the membrane thickness after drying was 0.13 μm. After application of the resist solution, prebaking on a direct hot plate was conducted under conditions of 110° C. and 60 seconds. The wafer on which a resist membrane had thus been formed was exposed in open frame using a simplified $F_2$ excimer laser exposing apparatus ["VUVES-4500" manufactured by Lithotec Japan K.K.] while gradually changing the exposure amount.

After exposure, post exposure baking on a hot plate was conducted at 110° C. for 60 seconds. Further, paddle development for 60 seconds was conducted with a 2.38 wt % tetramethylammoniumhydroxide aqueous solution.

The residual membrane thickness for the exposure amount after development was measured by Random Ace membrane thickness measuring meter (manufactured by Dainippon Screen Mfg. Co., Ltd.), and the minimum exposure amount (sensitivity) at which a resist shows membrane penetration (residual membrane thickness is 0) was measured. The results obtained are shown shown in Table 4.

TABLE 4

| Example No. | Effective sensitivity (mJ/cm$^2$) | Resolution (μm) | $F_2$ exposure sensitivity (mJ/cm$^2$) | Transmittance at 157 nm (%) |
|---|---|---|---|---|
| Example 15 | 8 | 0.16 | 8.5 | 88 |
| Example 16 | 7 | 0.15 | 6.0 | 84 |
| Example 17 | 4 | 0.17 | 4.0 | 79 |
| Example 18 | 2 | 0.17 | 3.0 | 79 |
| Example 19 | 7 | 0.15 | 5.5 | 75 |
| Example 20 | 7 | 0.14 | 4.5 | 70 |
| Example 21 | 21 | 0.16 | 8 | 82 |
| Example 22 | 11 | 0.17 | 5 | 79 |
| Comparative example 3 | 24 | 0.17 | >15 | 91 |
| Comparative example 4 | Not penetrated through membrane | | | 90 |

As apparent from Tables 2 and 4, the resists in the examples show high transmittance at a wavelength of 157 nm and excellent in balance of abilities. Further, as apparent from Table 2, the resists of the examples show further improved resolution and profile by using as a quencher a compound having a structure of the formula (VI). As shown in Table 4, high sensitivity in $F_2$ excimer laser exposure can be obtained by increasing the content of an acid generator. Even when the photo acid generators shown in Examples 21 and 22 are used, the resist show high transmittance at a wavelength of 157 nm and hig sensitivity in $F_2$ excimer laser exposure.

The chemical amplification type positive resist composition of the present invention shows high transmittance at a wavelength of 157 nm and excellent in balance of abilities. Therefore, this composition can manifest excellent abilities as resist for $F_2$ excimer laser.

What is claimed is:

1. A positive resist composition comprising a resin which itself is insoluble or poorly soluble in an alkali aqueous solution but becomes soluble in an alkali aqueous solution by the action of an acid, and an acid generator, wherein the content of halogen atoms in the resin is 40% by weight or more, at least one of structural units constituting the resin is a structural unit having an alicyclic hydrocarbon skeleton, and the structural unit having an alicyclic hydrocarbon skeleton contains therein at least one group rendering the resin soluble in an alkali aqueous solution by the action of an acid, and at least one halogen atom, wherein the cyclic hydrocarbon skeleton is an alicyclic hydrocarbon skeleton of the formula (2'):

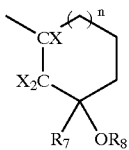

(2')

wherein X represents a halogen atom, $R_8$ represents a hydrogen or an acid-unstable group dissociating in the presence of an acid, $R_7$ represents an alkyl group having 1 to 6 carbon atoms substituted with at least one halogen atom or alicyclic hydrocarbon group substituted with at least one halogen atom, and n represents 0 or 1.

2. The positive resist composition according to claim 1 wherein the cyclic hydrocarbon skeleton of the formula (2) is an alicyclic hydrocarbon skeleton of the formula (4):

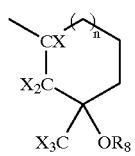

(4)

wherein X, $R_8$ and n have the same meanings as described above.

3. The positive resist composition according to claim 2 wherein $R_8$ is a group of the formula (5):

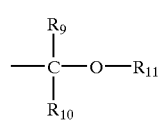

(5)

wherein $R_9$ and $R_{10}$ each independently represent an alkyl group having 1 to 14 carbon atoms or a hydrogen atom, the alkyl group may have at least one group selected from the group consisting of halogen atoms and alicyclic hydrocarbon groups; $R_{11}$ represents an alkyl group having 1 to 14 carbon atoms, alicyclic hydrocarbon group, lactone ring group or aromatic hydrocarbon group, the alkyl group may have at least one substituent selected from the group consisting of halogen atom, alicyclic hydrocarbon group and aromatic hydrocarbon group, the alicyclic hydrocarbon group, lactone ring group and aromatic hydrocarbon group in $R_{11}$ may each independently have at least one substituent selected from the group consisting of halogen atoms and alkyl groups.

4. The positive resist composition according to claim 3 wherein in the formula (5), $R_9$ and $R_{10}$ represent a hydrogen atom, and $R_{11}$ represents an ethyl group.

5. The positive resist composition according to claim 1 wherein the halogen atom is a fluorine atom.

6. The positive resist composition according to claim 1 wherein the structural unit having an alicyclic hydrocarbon skeleton is a structural unit of the formula (7):

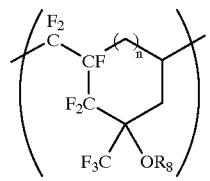

(7)

wherein n and $R_8$ have the same meanings as described above.

7. The positive resist composition according to claim 1 wherein the resin is a copolymer containing a structural unit of the following formula (8) and a structural unit of the following formula (8-1):

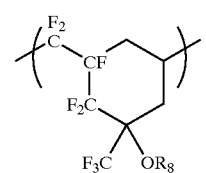

(8)

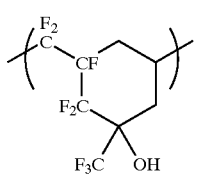

(8-1)

wherein $R_8$ has the same meaning as described above.

8. The positive resist composition according to claim 1 wherein the resin is a copolymer containing a structural unit of the following formula (9) and a structural unit of the following formula (9-1):

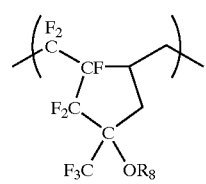

(9)

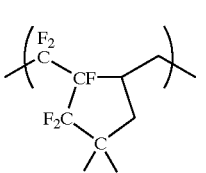

(9-1)

wherein, $R_8$ has the same meaning as described above.

9. The positive resist composition according to claim 1 wherein the acid generator is a compound of the general formula (14):

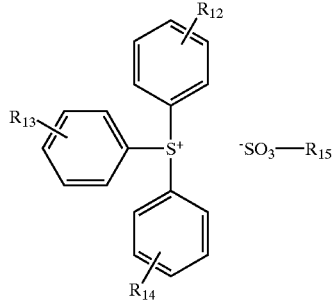

(14)

wherein $R_{12}$, $R_{13}$ and $R_{14}$ represent each independently a hydrogen atom, halogen atom, hydroxyl group, alkyl group having 1 to 14 carbon atoms or alkoxy group having 1 to 14 carbon atoms, wherein the alkyl group may have at least one substituent selected from the group consisting of halogen atoms, hydroxyl group, alicyclic hydrocarbon groups, lactone group and aromatic hydrocarbon groups, and the alicyclic hydrocarbon group, lactone group and aromatic hydrocarbon group may each independently have at least one substituent selected from the group consisting of halogen atoms, hydroxyl group and alkyl groups, the alkoxy group may have at least one substituent selected from the group consisting of halogen atoms, hydroxyl group, alicyclic hydrocarbon groups and aromatic hydrocarbon groups, the alicyclic hydrocarbon group and aromatic hydrocarbon group may each independently have at least one substituent selected from the group consisting of halogen atoms, hydroxyl group and alkyl groups; and $R_{15}$ represents straight chained or branched alkyl group optionally substituted with a halogen atom or alicyclic alkyl group optionally substituted with a halogen atom.

10. The positive resist composition according to claim 1 wherein the acid generator is a compound of the general formula (15):

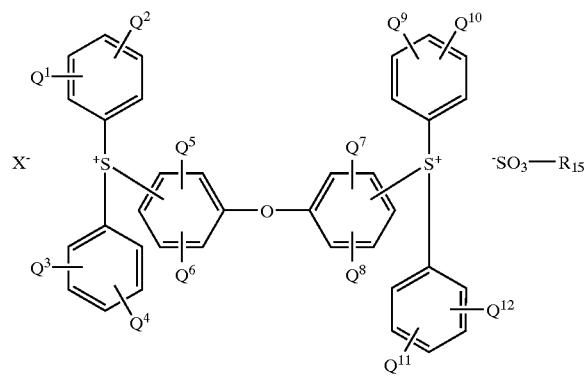

(15)

wherein $Q_1$ to $Q_{12}$ each independently represents hydrogen atom, hydroxyl group, straight chained or branched alkyl group having 1 to 6 carbon atoms or straight chained or branched alkoxy group having 1 to 6 carbon atoms; and $R_{15}$ represents straight chained or branched alkyl group optionally substituted with a halogen atom or alicyclic alkyl group optionally substituted with a halogen atom.

11. The positive resist composition according to claim 1 wherein the acid generator is a compound of the general formula (16):

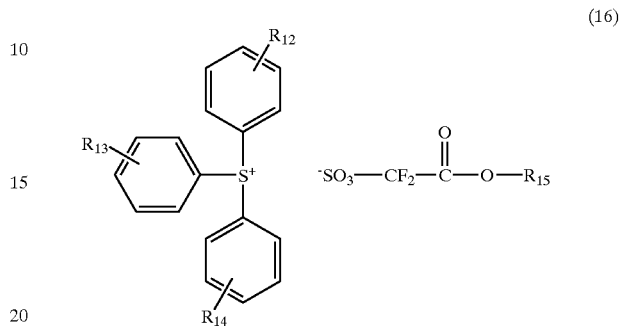

(16)

wherein $R_{12}$, $R_{13}$, $R_{14}$ represent each independently a hydrogen atom, halogen atom, hydroxyl group, alkyl group having 1 to 14 carbon atoms or alkoxy group having 1 to 14 carbon atoms, wherein the alkyl group may have at least one substituent selected from the group consisting of halogen atoms, hydroxyl group, alicyclic hydrocarbon groups, lactone group and aromatic hydrocarbon groups, and the alicyclic hydrocarbon group, lactone group and aromatic hydrocarbon group may each independently have at least one substituent selected from the group consisting of halogen atoms, hydroxyl group and alkyl groups, the alkoxy group may have at least one substituent selected from the group consisting of halogen atoms, hydroxyl group, alicyclic hydrocarbon groups and aromatic hydrocarbon groups, the alicyclic hydrocarbon group and aromatic hydrocarbon group may each independently have at least one substituent selected form the group consisting of halogen atoms, hydroxyl group and alkyl groups; and $R_{15}$ represents straight chained or branched alkyl group optionally substituted with a halogen atom or alicyclic alkyl group optionally substituted with a halogen atom.

12. The positive resist composition according to claim 9 wherein $R_{15}$ is a methyl group.

13. The positive resist composition according to claim 9 wherein $R_{15}$ is a trifluoromethyl group.

14. The positive resist composition according to claim 1 wherein the proportion of the resin is 80 to 99.9% by weight and the proportion of the acid generator is 20 to 0.1% by weight based on the total weight of the resin and acid generator.

15. The positive resist composition according to claim 1 wherein the composition further comprises a basic compound.

16. The positive resist composition according to claim 15 wherein the proportion of the basic compound is 0.001 to 1 part by weight based on 100 parts by weight of the resin.

17. The positive resist composition according to claim 15 wherein the basic compound is a compound of the following formula (17):

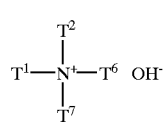  (17)

wherein $T^1$, $T^2$ and $T^7$ each independently represent alkyl, cycloalkyl or aryl, and the aryl preferably has about 6 to 10 carbon atoms, at least one hydrogen on the alkyl, cycloalkyl or aryl may each independently be substituted with a hydroxyl group, an amino group, or an alkoxy group having 1 to 6 carbon atoms, and at least one hydrogen on the amino group each independently may be substituted with an alkyl group having 1 to 4 carbon atoms; $T^6$ represents alkyl or cycloalkyl, at least one hydrogen on the alkyl or cycloalkyl may each independently be substituted with a hydroxyl group, an amino group, or an alkoxy group having 1 to 6 carbon atoms, and at least one hydrogen on the amino group may be substituted with an alkyl group having 1 to 4 carbon atoms.

18. The positive resist composition according to claim 1 wherein the resin is a partially ethoxymethylated copolymer comprising the formulae:

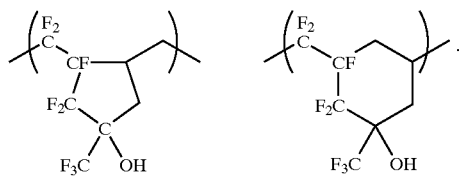

19. The positive resist composition according to claim 1 wherein the resin is a product obtained by partial ethoxymethylation of a copolymer comprising the formulae:

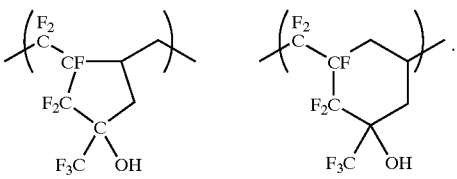

20. The positive resist composition according to claim 1 wherein the resin is a partially ethoxymethylated copolymer consisting of the formulae:

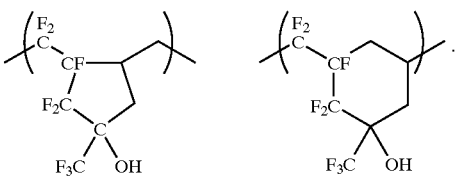

21. The positive resist composition according to claim 1 wherein the resin is a product obtained by partial ethoxymethylation of a copolymer consisting of the formulae:

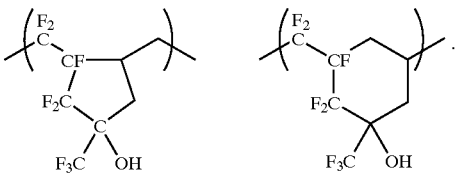

* * * * *